(12) United States Patent
Tan

(10) Patent No.: US 7,772,865 B2
(45) Date of Patent: Aug. 10, 2010

(54) PROBE FOR TESTING INTEGRATED CIRCUIT DEVICES

(75) Inventor: Yin Leong Tan, Singapore (SG)

(73) Assignee: Test Max Manufacturing Pte Ltd, Singapore (SG)

(*) Notice: Subject to any disclaimer, the term of this patent is extended or adjusted under 35 U.S.C. 154(b) by 184 days.

(21) Appl. No.: 12/088,853

(22) PCT Filed: Sep. 29, 2006

(86) PCT No.: PCT/SG2006/000290

§ 371 (c)(1), (2), (4) Date: Apr. 1, 2008

(87) PCT Pub. No.: WO2007/043977

PCT Pub. Date: Apr. 19, 2007

(65) Prior Publication Data

US 2009/0189622 A1    Jul. 30, 2009

(30) Foreign Application Priority Data

Oct. 14, 2005    (SG) .............................. 200506720-2

(51) Int. Cl.
*G01R 31/02* (2006.01)
(52) U.S. Cl. ...................................... 324/761
(58) Field of Classification Search ........................ None
See application file for complete search history.

(56) References Cited

U.S. PATENT DOCUMENTS

| | | | | |
|---|---|---|---|---|
| 4,806,856 A * | 2/1989 | Hvezda et al. | ............... | 324/761 |
| 5,456,621 A * | 10/1995 | Gan | ............................ | 439/700 |
| 6,146,151 A * | 11/2000 | Li | ................................ | 439/66 |
| 6,424,166 B1 * | 7/2002 | Henry et al. | ................ | 324/755 |
| 6,462,567 B1 * | 10/2002 | Vinther et al. | .............. | 324/754 |
| 6,506,082 B1 * | 1/2003 | Meek et al. | ................. | 439/700 |
| 7,025,602 B1 * | 4/2006 | Hwang | ........................ | 439/66 |
| 7,256,593 B2 * | 8/2007 | Treibergs | .................... | 324/754 |
| 7,520,754 B1 * | 4/2009 | Gattuso | ....................... | 439/66 |
| 2006/0261831 A1 * | 11/2006 | Chou et al. | ................. | 324/761 |

\* cited by examiner

*Primary Examiner*—Paresh Patel
(74) *Attorney, Agent, or Firm*—Pyprus Pte Ltd

(57) ABSTRACT

A device for providing electrical contact comprises a first reciprocating conductive body having a first abutting body at one end, a second reciprocating conductive body having a second abutting body at one end and a resilient means biasing the first reciprocating conductive body and the second reciprocating conductive body in opposing directions axially away from each other. The first abutting body is slidably abutting the second abutting body, thereby providing electrical conductivity between the first reciprocating conductive body and the second reciprocating body. In another embodiment, the first reciprocating conductive body, the second reciprocating body and at least one securing means are disposed within one of plurality of through holes of an elastic non-conductive housing body. The elastic non-conductive housing body biases the first reciprocating conductive body and the second reciprocating conductive body in opposing directions axially from each other.

24 Claims, 6 Drawing Sheets

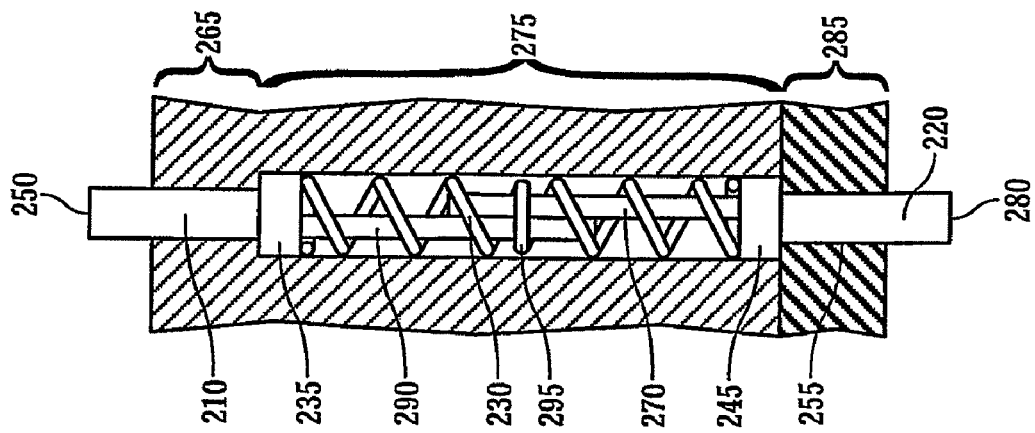
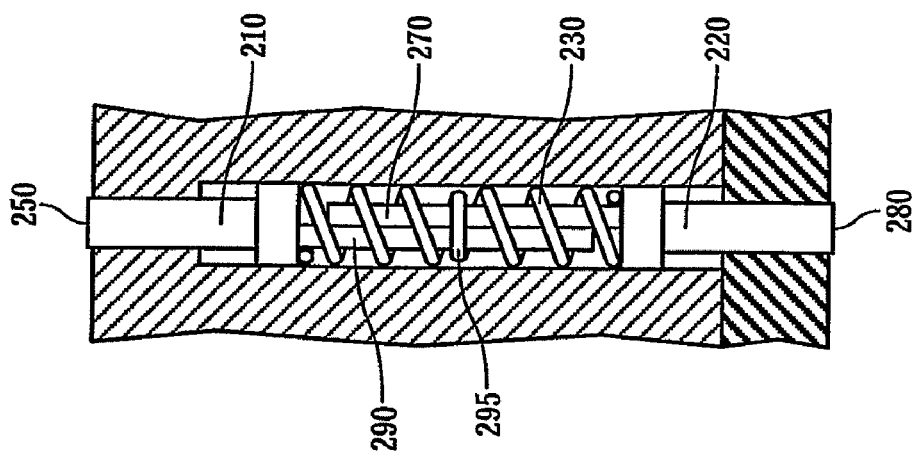
FIG. 2b
FIG. 2a

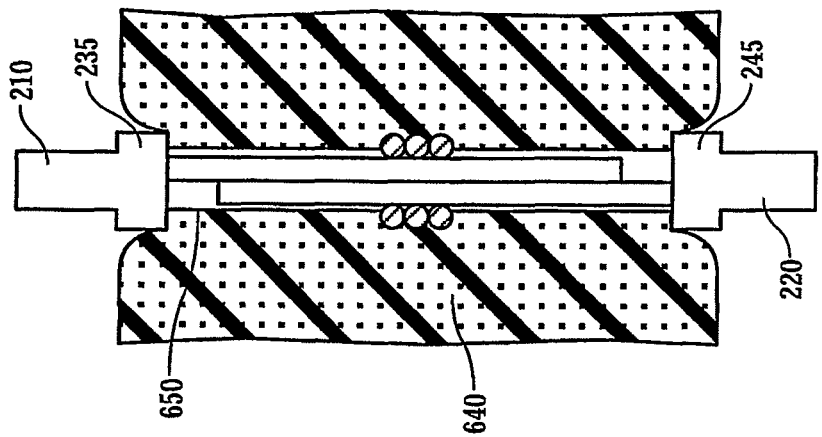
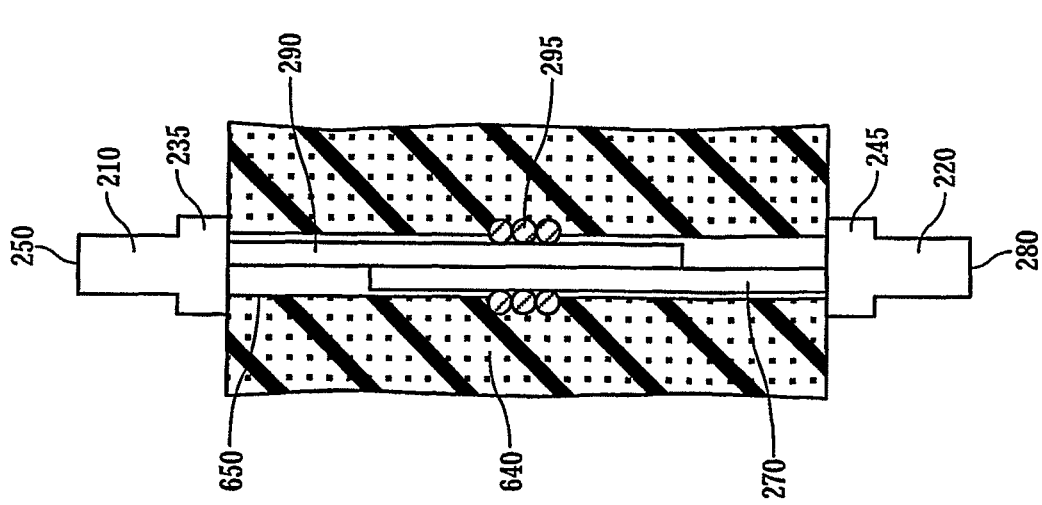
FIG. 6b
FIG. 6a

PROBE FOR TESTING INTEGRATED CIRCUIT DEVICES

FIELD OF THE INVENTION

The present invention relates to electrical contact probes. In particular, this invention relates to electrical contact probes for providing electrical contact between diagnostic or testing apparatus and a device under test (DUT) and a method for providing the electrical contact.

BACKGROUND OF THE INVENTION

Contact probes are used in the electrical circuit test industry. They provide electrical contact between a device under test (DUT) and a diagnostic or testing apparatus such as a test circuit board. These contact probes are normally housed in non-conductive test sockets, which acts an interface between the test circuit board and the DUT.

A conventional spring loaded contact probe generally includes an outer receptacle, a movable plunger, a barrel containing the plunger and a spring for biasing the reciprocating travel of the plunger in the barrel. The barrel is normally mounted within the receptacle with the plunger extending outwardly from the receptacle. All parts of the conventional spring loaded contact probe are preferably made of electrically conductive materials, so that an electrical circuit is maintained between the DUT and testing apparatus.

The barrel is normally crimped about a reduced area of the plunger, allowing the plunger to reciprocate relative to the barrel. Crimping requires an extra step of manufacture and is difficult in an item so small. Large surface area of contact is also highly desirable as electrical resistance is reduced with increase in surface area of contact. One of the objects of the invention is to provide an increased surface area of contact between plungers so that electrical resistance is greatly reduced.

The manufacturing of a barrel of a conventional spring loaded contact probe involves the extrusion of a metallic material into a hollow cylinder. This extrusion process results in rough surfaces on the hollow cylinder. These rough surface areas will result in reduction of surface area of contact and inconsistency of contact between the probes and the interior of the barrel when the probes are sliding within the barrel.

Components of the probe are normally plated with galvanic nickel, chemical nickel, hard gold, rhodium or silver to protect parts of the probe against corrosion and abrasion, as well as to reduce contact resistance due to rough surface area. Crevices on the probe and interior of the barrel are hard to reach places which plating thereon may not be possible. Furthermore, plating on the rough surfaces, which are a result of the extrusion process, does not eliminate problem of the surface being rough and uneven. Again, the problem of reduction of surface area of contact and inconsistency of contact between the probes and the interior of the barrel still exist.

In FIG. 1, an illustration is shown of a conventional spring loaded contact probe 160 found in the prior art. The contact probe 160 comprises of an electrically conducting barrel 110, a plunger 150 for contact with a DUT, a plunger 120 for contact with a circuit board, and a helical spring 130 coupled to both plungers 150, 120. The plunger 150 for contact with a DUT has a contact drill point 140 for maintaining contact with the DUT. The plunger 120 for contact with the circuit board has a contact drill point 190 for maintaining contact with the circuit board.

The plungers 150, 120 and the helical spring 130 are housed within the barrel 110. All parts of the contact probe 160 are axially aligned on a single axis. The plungers 150, 120 are slidably disposed within the barrel 110, which is crimped at both ends to limit the outwardly directed axial displacement of the plungers 150, 120 from the barrel 110. The barrel is necessary for electrical conductivity between both contacts. The surface areas of contact between the plungers 150, 120 and the barrel 110 are constant.

Conduction of electrical signals from one end of the plunger to the other end is through a metal plating on the inside of the barrel. Electrical resistance is inversely proportional to the square of the area of contact. By increasing the surface area of contact, there is less resistance. However, with constant surface area of contact between the plunger and barrel of the probe of the prior art, electrical resistance remains constant and may even increase with reduction of surface area of contact due to wear and tear. This is highly undesirable, as the reliability of the device will be greatly affected. Having the barrel in the probe of the prior art and the spring as a resilient means pose problems as discussed above.

SUMMARY OF THE INVENTION

The present invention seeks to provide a device for providing electrical contact The device comprises a first reciprocating conductive body having a first contact at one end and a first abutting body at another end; a second reciprocating conductive body having a second contact at one end and a second abutting body at another end; and a resilient means biasing the first reciprocating conductive body and the second reciprocating conductive body in opposing directions axially away from each other, wherein the first abutting body is slidably abutting the second abutting body, thereby providing electrical conductivity between the first reciprocating conductive body and the second reciprocating body.

Accordingly, in one aspect, the present invention provides a device for providing electrical contact between a DUT and a diagnostic or testing apparatus. The device comprises a plurality of first reciprocating conductive bodies each having a first contact at one end and a first abutting body at another end; a plurality of second reciprocating conductive bodies each having a second contact at one end and a second abutting body at another end; a plurality of securing means each for holding each of the plurality of first reciprocating conductive bodies and the second reciprocating conductive body together such that the first abutting body is slidably abutting the second abutting body; and a non-conductive housing having a plurality of through holes wherein the plurality of first reciprocating conductive bodies, the plurality of second reciprocating conductive bodies and the plurality of securing means are disposed therein, wherein the non-conductive housing biases the plurality of first reciprocating conductive bodies and the plurality of second reciprocating conductive bodies in opposing directions axially away from each other when pressure is applied on the first contact of the plurality of first reciprocating conductive bodies or the second contact of the plurality of second reciprocating conductive bodies.

In another aspect, the present invention provides a method of providing electrical contact between a first point and a second point. The method comprises the steps of (a) providing a device comprising a first reciprocating conductive body having a first contact at one end and a first abutting body at another end; a second reciprocating conductive body having a second contact at one end and a second abutting body at another end; and a resilient means biasing the first reciprocating conductive body and the second reciprocating conductive body in opposing directions axially away from each other, wherein the first abutting body is slidably abutting the second abutting body, thereby providing electrical conductivity between the first reciprocating conductive body and the second reciprocating body; (b) allowing the first contact of the first reciprocating conductive body to be in contact with the first point; and (c) allowing the second contact of the second reciprocating conductive body to be in contact with the second point.

In another aspect, the present invention provides a method of providing electrical contact between a DUT and a diagnostic apparatus or testing apparatus comprises integrated circuit board. The method comprises the steps of (a) providing a device comprising a plurality of first reciprocating conductive bodies each having a first contact at one end and a first abutting body at another end; a plurality of second reciprocating conductive bodies each having a second contact at one end and a second abutting body at another end; a plurality of securing means for holding the plurality of first reciprocating conductive bodies and the second reciprocating conductive body together such that the first abutting body is slidably abutting the second abutting body; and a non-conductive housing having a plurality of through holes wherein the plurality of first reciprocating conductive bodies, the plurality of second reciprocating conductive bodies and the plurality of securing means are disposed therein, wherein the non-conductive housing biases the plurality of first reciprocating conductive bodies and the plurality of second reciprocating conductive bodies in opposing directions axially away from each other when pressure is applied on the first contact of the plurality of first reciprocating conductive bodies or the second contact of the plurality of second reciprocating conductive bodies; (b) having the first contacts of the plurality of first reciprocating conductive bodies to be in contact with the DUT; and (c) having the second contacts of the plurality of second reciprocating conductive bodies to be in contact with the diagnostic apparatus or testing apparatus comprising integrated circuit board.

BRIEF DESCRIPTION OF THE DRAWINGS

A preferred embodiment of the present invention will now be more fully described, by way of example, with reference to the drawings of which:

FIG. 2a illustrates a cross-sectional view of one embodiment of the device in a compressed state;

FIG. 2b illustrates a cross-sectional view of one embodiment of the device in a resting state;

FIG. 6a illustrates a cross-sectional view of another embodiment of the device in a resting state;

FIG. 6b illustrates a cross-sectional view of another embodiment of the device in a compressed state.

DETAILED DESCRIPTION OF THE DRAWINGS

Figure 1:
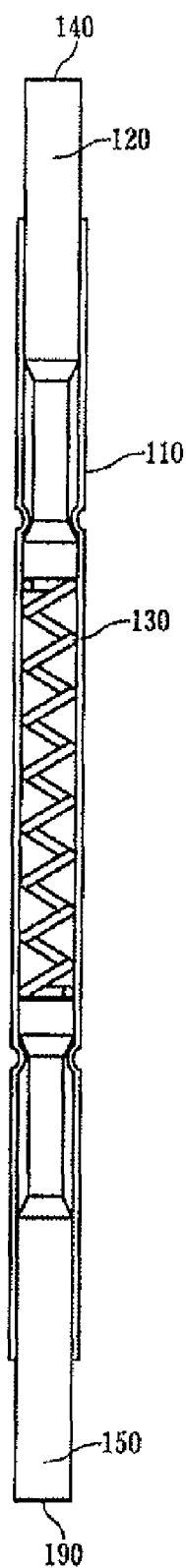
FIG. 1 illustrates a cross-sectional view showing a probe found in the prior art.

In accordance with a preferred embodiment of the invention are described. In the following description, details are provided to describe the preferred embodiment. It shall be apparent to one skilled in the art, however, that the invention may be practiced without such details. Some of these details may not be described at length so as not to obscure the invention.

In the present embodiment, electrical conductivity through the device of the present invention is achieved through a pair of conductive plungers in contact with each other without the need of an electrically conducting barrel. As the device of the present invention is compressed, the surface area of the contact between the conductive plungers increases. With the increase of surface area of contact between the conductive plungers, electrical resistance is greatly decreased, thereby improving the conductivity between the conductive plungers and reliability of the device.

Furthermore, there are advantageously no hidden interiors or hard to reach areas in the parts of the device as all surfaces to be plated are exposed, hence all parts can be plated with the desired metal with much ease. The manufacturing process of the device of the present invention is advantageously simplified.

In another embodiment, no spring is used to bias the pair of conductive plungers. The plurality of conductive contact probes are housed in an elastic non-conductive housing that will bias each pair of conductive plungers. This will greatly diminish or eliminate the problems associated with the use of springs in contact probes. Parts of the contact probe of the present invention such as the plunger may be advantageously replaced individually without having to change the whole elastic non-conductive housing.

Referring to FIG. 2a, a cross sectional view of the device 200 of the present invention in a compressed state is shown. The device 200 comprises of a first reciprocating conductive body 210, a second reciprocating conductive body 220, and a resilient means 230 coupled to both reciprocating conductive bodies 210, 220. The first reciprocating conductive body 210 is axially disposed of the second reciprocating conductive body 220. The resilient means 230 biases the first reciprocating conductive bodies 210 and the second reciprocating conductive body 220 in opposing directions axially away from each other.

The first reciprocating conductive body 210 further comprises a first contact 250 at one end for making a contact with a first point and a first abutting body 290 at another end. The first reciprocating conductive body 210 may be an elongate body, having at least one flat surface longitudinally.

The second reciprocating conductive body 220 further comprises a second contact 280 at one end for making a contact with a second point, and a second abutting body 270 at another end. The second reciprocating conductive body 220 may be an elongate body, having at least one flat surface longitudinally.

The first contact end 250 and the second contact end 280 are displaced in opposing directions of each other on a single axis. The first contact end 250 and the second contact end 280 are at opposing ends of the device 200 for providing electrical contact between two points. The two points may each be a DUT and a circuit board, testing or diagnostic apparatus. The flat surface of the first abutting body 290 is slidably abutting the flat surface of the second abutting body 270.

As the probe is compressed, the surface area of contact between the first abutting body 290 and the second abutting body 270 increases, advantageously reducing electrical resistance. In a fully compressed state, the first abutting body 290 is substantially in contact with the second abutting body 270 at the at least one flat surface, thereby achieving maximum surface area of contact.

The first abutting body 290 and the second abutting body 270 are disposed within the resilient means 230. The resilient means 230 is biasing the first reciprocating conductive body 210 and the second reciprocating conductive body 220 in opposing directions axially away from each other. The resilient means 230 has a first end coupled to the first reciprocating conductive body 210 and a second end coupled to the second reciprocating conductive body 220. The resilient means 230 further having a middle region 295 comprising of a securing means for securing both the first abutting body 290 and the second abutting body 270 together, so that the first abutting body 290 and the second abutting body 270 are slidably abutting each other.

Referring to FIG. 2b, a cross sectional view of the device 200 of the present invention in a resting state is shown. The first reciprocating conductive body 210 further comprises a first restrictive body 235 disposed between the two ends of the first reciprocating conductive body 210. The second reciprocating conductive body 220 further comprises a second restrictive body 245 disposed between the two ends of the second reciprocating conductive body 220.

In another embodiment, the device 200 is disposed within a through hole 255 of a non-conductive housing 265 having at least one through hole 255. The through hole 255 comprises of a first region 265, a second region 285 and a third region 275. The first region 265 is at a first opening of the through hole 255, for displacing first reciprocating conductive body 235 out of the through hole 255. The second region 285 is at a second opening of the through hole 255, for displacing the second reciprocating conductive body 220 out of the through hole 255.

The diameter of the first region 265 corresponds to the diameter of the first reciprocating conducting body 210 at the one end of the first contact 250, allowing the first contact 250 to be displaced out of the through hole 255 to make a contact with the first point. The diameter of the second region 285 corresponds to the diameter of the second reciprocating conducting body 220 at the one end of the second contact 280, allowing the second contact 280 to be displaced out of the through hole 255 to make a contact with the second point.

The diameter of the third region 275 corresponds with the diameter of the first restrictive body 235. The first reciprocating conductive body 210 with the first restrictive body 235 can thereby be displaced within the through hole 255. The diameter of the third region 275 corresponds with the diameter of the second restrictive body 245. The second reciprocating conductive body 220 with the second restrictive body 245 can thereby be displaced within the through hole 255.

In the resting position, the resilient means 230 biases the first reciprocating conductive body 210 and the second reciprocating conductive body 220 in opposing directions axially away from each other. As the diameter of the through hole 255 at the first region 265 is smaller than the diameter of the first restrictive body 235, the displacement of the first reciprocating conductive body 210 is restricted by the first restrictive body 235. As the diameter of the through hole 255 at the second region 285 is smaller than the diameter of the second restrictive body 245, the displacement of the second reciprocating conductive body 220 is restricted by the second restrictive body 245. As such, the device 200 in its resting position remains disposed within the through hole 255 of the non-conductive housing 265.

The first reciprocating conductive body 210 and the second reciprocating conductive body 220 can be made of any electrical conducting materials. Surfaces of the first reciprocating conductive body 210 and the second conductive reciprocating body 220 are plated with any electrical conducting materials.

Figure 3:
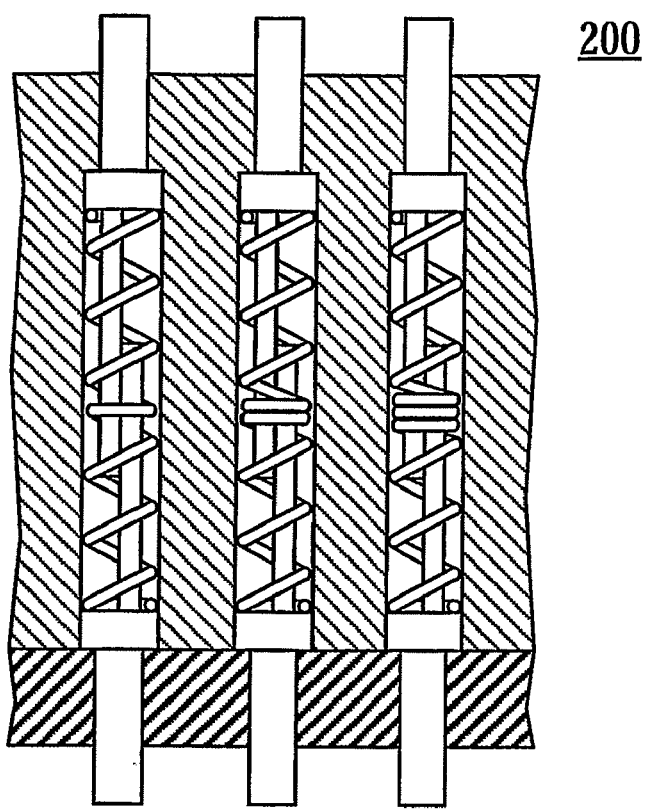
FIG. 3 illustrates three cross-sectional views of the device having at least one securing means.

In one example, the resilient means 230 is a helical spring made of conductive material. The securing means 295 that comprises of at least one concentric ring holds the first conductive reciprocating body 210 and the second conductive reciprocating body 220 securely together. The securing means 295 acts on the first conductive reciprocating body 210 and the second conductive reciprocating body 220 such that the first abutting body 290 is constantly slidably in contact with the second abutting body 270. Referring to FIG. 3, three examples of the securing means comprising of at least one concentric ring are shown.

In another example, the resilient means is a helical spring 230 having a centre portion 295 disposed between two opposing ends of the helical spring 230. The diameter of the helical spring 230 at the centre portion 295 is smaller than the diameters of the helical spring at the two opposing ends. The helical spring 230 at the centre portion 295 holds the first reciprocating conductive body 210 and the second reciprocating conductive body 220 together for electrical contact therebetween, such that the first abutting body 290 is slidably abutting the second abutting body 270.

Figure 4A:
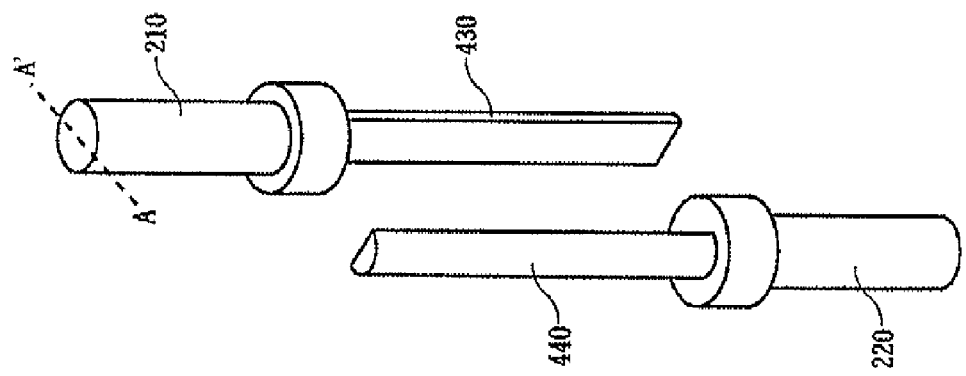
FIG. 4a illustrates a perspective view of the first conductive reciprocating body and the second conductive reciprocating body each having one flat surface.

Referring to FIG. 4a, one example of the abutting bodies is shown. The first abutting body 430 is having one flat surface for abutting with one flat surface of a second abutting body 440. The first abutting body 430 and the second abutting body 440 each has equal semi-circular cross section throughout the entire length. When the flat surface of first abutting body 430 is completely in contact with the flat surface of the second abutting body 440, both abutting bodies 430, 440 form an elongated cylindrical body having equal circular cross section throughout the entire length.

Figure 4B:
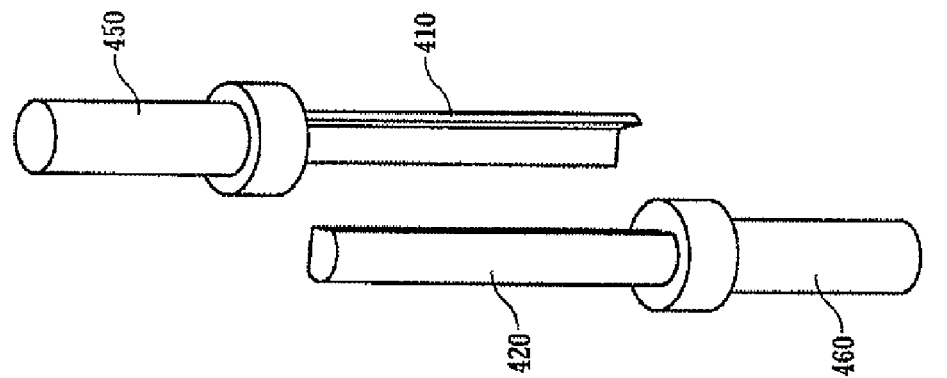
FIG. 4b illustrates a perspective view of the first conductive reciprocating body and the second conductive reciprocating body each having two flat surfaces.

In another example as shown in FIG. 4b, a first abutting body 410 is having two flat surfaces for abutment with the two flat surfaces of a second abutting body 420. When the two flat surfaces of the first abutting body 410 are completely in contact with the two flat surfaces of the second abutting body 420, both abutting bodies 410, 420 form an elongated cylindrical body having equal circular cross section throughout the entire length. By having two flat surfaces for abutment, the contact area between both abutting bodies 410, 420 is advantageously increased.

Figure 5:
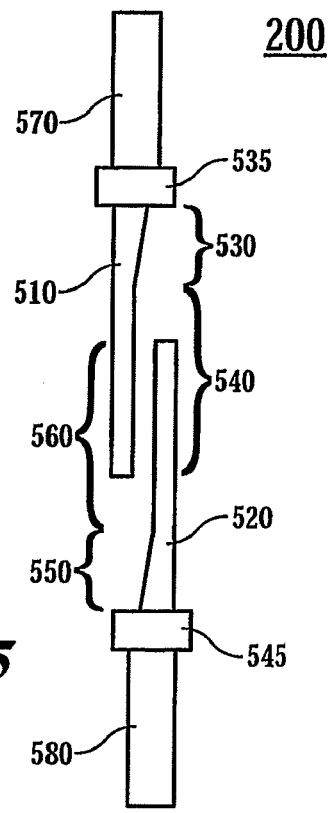
FIG. 5 illustrates an example of a cross-sectional view of the first conductive reciprocating body and the second conductive body.

FIG. 5 shows another example of a cross-sectional view as seen along line A-A' of FIG. 4a. In this example, the first abutting body 510 and the second abutting body 520 each do not have equal cross sectional area throughout its entire length.

The entire length of the first abutting body 510 comprises of a first length 530 and a second length 540, the first length 530 being contiguous to the first restrictive body 535. The cross sectional area of the first length 530 of the first abutting body 510 decreases gradually from the first restrictive body 535 to the start of the second length 540, where the semi-circular cross sectional area of the second length 540 remains constant throughout the entire second length 540. The first length 530 of the first abutting body 510 forms a first tapering section.

The entire length of the second abutting body 520 further comprises of a first length 550 and a second length 560, the first length 550 being contiguous to the second restrictive body 545. The cross sectional area of the first length 550 of the second abutting body 520 decreases gradually from the second restrictive body 545 to the start of the second length 560, where the semi-circular cross section area of the second length 560 remains constant throughout the entire second length 560. The first length 550 of the second abutting body 520 forms a second tapering section.

At least one securing means hold the first abutting body 510 together with the second abutting body 520 such that both abutting bodies 510, 520 are slidably abutting each other. The flat surface of the first abutting body 510 at the second length 540 is thus in full contact with the flat surface of the second abutting body 520 at the second length 560. When the first conductive reciprocating body 570 or the second conductive reciprocating body 580 is compressed, the first abutting body 510 acts on the second tapering section, and vice versa. As a result, the second tapering section and the first tapering section act on the first abutting body 510 and the second abutting body 520 respectively in outward opposing directions perpendicular the axis of the abutting bodies 510, 520.

However the securing means holding both abutting bodies 510, 520 and the opposing action of the tapering bodies on each abutting body 510, 520 provide a tighter grip of both abutting bodies 510, 520, thereby ensuring constant contact between both abutting bodies 510, 520 at the flat surfaces.

Referring to FIG. 6a, a cross-sectional view of spring-less contact probe 600 for providing electrical contact between a DUT and a diagnostic or testing apparatus is shown. The contact probe 600 comprises a first reciprocating conductive body 210, a second reciprocating conductive body 220 and at least one securing means 295. The first reciprocating conductive body 210, the second reciprocating conductive body 220 and the at least one securing means 295 are housed in a through hole 650 of an elastic non-conductive housing body 640.

The non-conductive housing body 640 is an elastomer for biasing the first reciprocating conductive body 210 and the second reciprocating conductive body 220 in opposing directions axially away from each other. The first reciprocating conductive body 210 and the second reciprocating conductive body 220 of FIG. 4a are housed in a through hole 650 of the elastic non-conductive housing body 640 of FIG. 6a.

The first reciprocating conductive body 210 further comprises a first contact 250 at one end for making a contact with a first point and a first abutting body 290 at another end. The first reciprocating conductive body 210 further comprises a first restrictive body 235 disposed between the two ends of the first reciprocating conductive body 210. The first reciprocating conductive body 210 may be an elongate body, having at least one flat surface longitudinally.

The second reciprocating conductive body 220 further comprises a second contact 280 at one end for making a contact with a second point, and a second abutting body 270 at another end. The second reciprocating conductive body 220 further comprises a second restrictive body 245 disposed between the two ends of the second reciprocating conductive body 220. The second reciprocating conductive body 220 may be an elongate body, having at least one flat surface longitudinally.

The at least one securing means 295 secures both the first abutting body 290 and the second abutting body 270 together, so that the first abutting body 290 and the second abutting body 270 are slidably abutting each other. The first reciprocating conductive body 210, the second reciprocating conductive body 220 and the at least one securing means 295 are disposed within the through hole 650 of the elastic non-conductive housing body 640. The at least one securing means 295 also secures the first reciprocating conductive body 210 and the second reciprocating conductive body 220 within the through hole 650 of the elastic non-conductive housing body 640 thereby preventing the first reciprocating conductive body 210 and the second reciprocating conductive body 220 from displacing out of the through hole 650. The through hole 650 is of substantially equal cross sectional area throughout the entire length of the through hole 650.

The first restrictive body 235 is having a diameter larger than the diameter of the through hole 650. The first restrictive body 235 is disposed on one of the openings of the through hole 650 such that when the first restrictive body 235 is compressed, the first restrictive body 235 prevents the first reciprocating conductive body 210 from displacing into the through hole 650.

The second restrictive body 245 is having a diameter larger than the diameter of the through hole 650. The second restrictive body 235 is on the other one of the openings of the through hole 650 such that when the second restrictive body 245 is compressed, the second restrictive body 245 prevents the second reciprocating conductive body 220 from displacing into the through hole 650.

The diameter of the through hole 650 is sufficiently large enough for housing the first abutting body 290 and the second abutting body 270, such that the first abutting body 290 and the second abutting body 270 are not in contact with the wall of the through hole 650 when the at least one securing means holds the first abutting body 290 and the second abutting body 270 together. This prevents further wear and tear of the abutting bodies 290, 270 from contact with the wall of the through hole 650.

Referring to FIG. 6b, a compressed device of FIG. 6a is shown. When either the first reciprocating conductive body 210 or the second reciprocating conductive body 220 is compressed, the elastic non-conductive housing body 640 at the openings of the through hole 650 acts on the first restrictive body 235 and the second restrictive body 245. Due to the elastic nature of the elastic non-conductive housing body 640, the elastic non-conductive housing body 640 biases the first reciprocating conductive body 210 and the second reciprocating conductive body 220 in opposing directions axially away from each other. This advantageously eliminates the problems associated with the use of a helical spring as a resilient means to bias the first reciprocating conductive body 210 and the second reciprocating conductive body 220.

Figure 7:
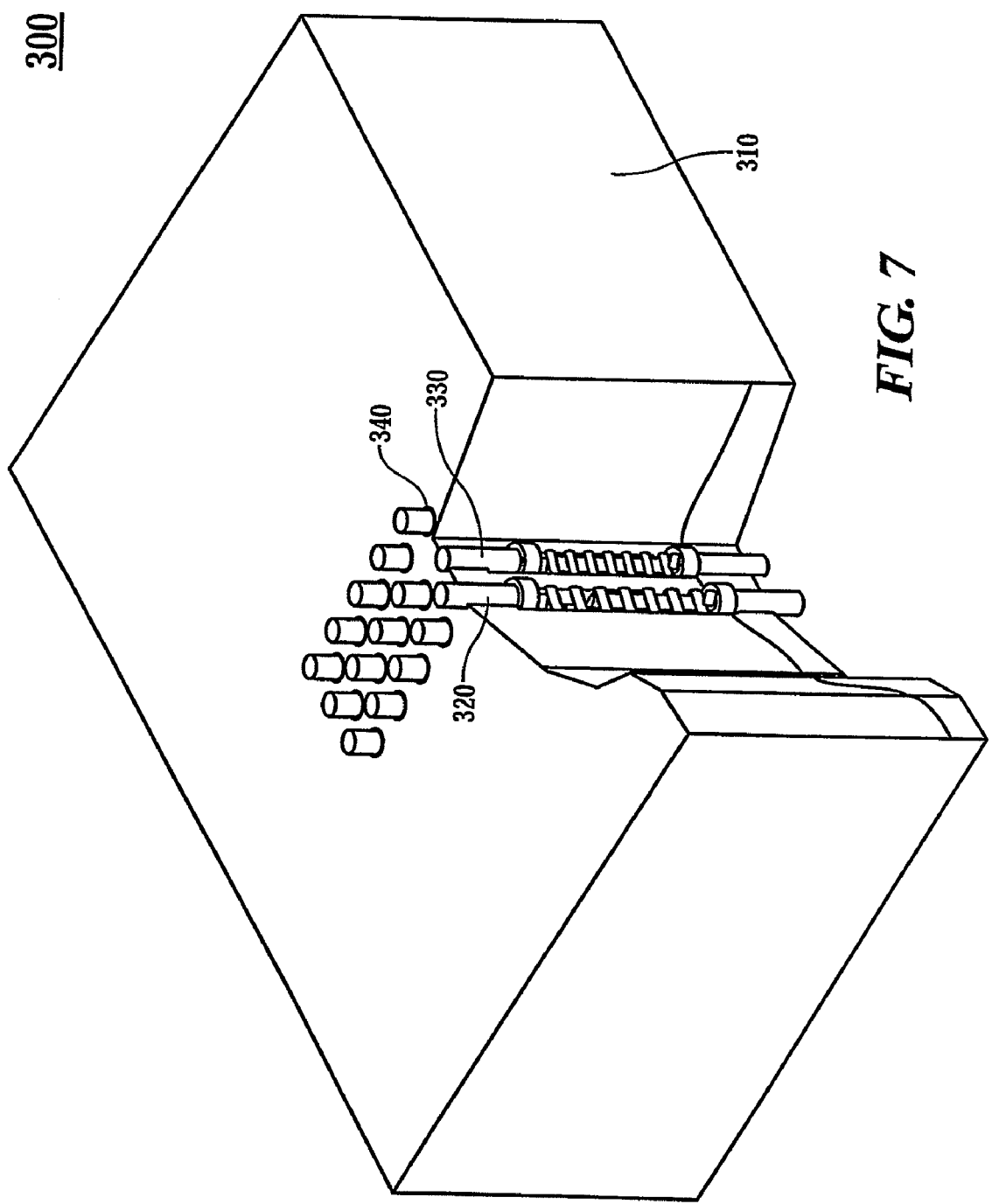
FIG. 7 illustrates a perspective view of a plurality of the devices of the present invention in a non-conductive housing having at least one through hole.

Referring to FIG. 7, a perspective view of a plurality of the devices of the present invention of FIGS. 2a and 2b disposed in at least one through hole 340 of a non-conductive housing 310 having at least one through hole 340 is shown. The perspective view of the device of FIG. 2a in a resting position 320 and the device of FIG. 2b in a compressed position 330 is shown.

It will be appreciated that although some embodiments have been described in detail, various modifications and improvements can still be made by a person skilled in the art without departing from the scope of the present invention. For example, a barrel or sleeve with a bore may be disposed in the through hole 255 of the third region 275 of the embodiment shown in FIGS. 2a and 2b or the through hole 650 shown in FIGS. 6a and 6b. The bore of the barrel/sleeve allows the first and second conductive abutting bodies 270,290 to slidably abut each other. In addition, the barrel/sleeve allows the conductive abutting bodies to be pre-assembled for ease of installation.

The invention claimed is:

1. A device for providing electrical contact, the device comprising:
   a first reciprocating conductive body having a first contact at one end and a first abutting body at another end;

a second reciprocating conductive body having a second contact at one end and a second abutting body at another end; and a helical spring biasing the first reciprocating conductive body and the second reciprocating conductive body in opposing directions axially away from each other, wherein the helical spring comprises an intermediate concentric coil that is smaller than diameter of coils at opposing ends such that the intermediate concentric coil biases the first abutting body against the second abutting body;

wherein the first abutting body comprises two flat surfaces that are arranged in a V form and the second abutting body comprises two flat surface that are arranged in a matching but inverted V form so that the first abutting body is slidably abutting the second abutting body, thereby providing electrical conductivity between the first reciprocating conductive body and the second reciprocating body.

2. The device in accordance with claim 1, wherein surface area of contact between first abutting body and the second abutting body increases as the first reciprocating conductive body is displaced in the direction towards the second reciprocating conductive body.

3. The device in accordance with claim 1, wherein the first reciprocating conductive body is axially disposed to the second reciprocating conductive body.

4. The device in accordance with claim 1, wherein the helical spring is having a first end coupled to the first reciprocating conductive body and a second end coupled to the second reciprocating conductive.

5. The device in accordance with claim 1, wherein the concentric coil is located at a centre portion between two opposing ends of the helical spring.

6. The device in accordance with claim 1, wherein the first abutting body and the second abutting body are disposed within the helical spring.

7. The device in accordance with claim 1, wherein the device is disposed within a through hole of a non-conductive housing having at least one through hole.

8. The device in accordance with claim 1, wherein the first reciprocating conductive body further having a first restrictive body located between the two ends of the first reciprocating conductive body, and the second reciprocating conductive body further having a second restrictive body located between the two ends of the second reciprocating conductive body.

9. The device in accordance with claim 8, wherein the at least one through hole having a first region, a second region and a third region, the first region and the second region are at the openings of the through hole, the third region is between the first region and the second region.

10. The device in accordance with claim 9, wherein the diameter of the first region corresponds to the diameter of the first reciprocating conductive body at the one end of the first contact, and the diameter of the second region corresponds to the diameter of the second reciprocating conductive body at the one end of the second contact.

11. The device in accordance with claim 10, wherein the diameter of the third region corresponds to the diameters of the first restrictive body and the second restrictive body, thereby allowing axial displacement of the first reciprocating conductive body and the second reciprocating conductive body within the through hole.

12. The device in accordance with claim 11, wherein the diameter of the first region and the diameter of the second region are smaller than the diameter of the third region.

13. The device in accordance with claim 11, wherein the diameter of the first region and the diameter of the second region are smaller than the diameter of the first restrictive body and the diameter of the second restrictive body respectively, thereby restricting the displacement of the first reciprocating conductive body and the second reciprocating conductive body out of the at least one through hole.

14. A device for providing electrical contact, the device comprising:

a first reciprocating conductive body having a first contact at one end, a first abutting body at another end and a first restrictive body located between the two ends;

a second reciprocating conductive body having a second contact at one end, a second abutting body at another end and a second restrictive body located between the two ends; and a helical spring biasing the first reciprocating conductive body and the second reciprocating conductive body in opposing directions axially away from each other, wherein the helical spring comprises an intermediate concentric coil that is smaller than diameter of coils at opposing ends such that the intermediate concentric coil biases the first abutting body against the second abutting body; wherein the first abutting body has a first length and a second length, the first length being contiguous to the first restrictive body, wherein the cross sectional area of the first length of the first abutting body decreases gradually from the first restrictive body to the start of the second length and the cross sectional area of the second length remains constant throughout the entire second length.

15. The device in accordance with claim 14, wherein the second abutting body has a third length and a fourth length, the third length being contiguous to the second restrictive body, wherein the cross sectional area of the third length of the second abutting body decreases gradually from the second restrictive body to the start of the fourth length and the cross sectional area of the fourth length remains constant throughout the entire fourth length.

16. A device for providing electrical contact between a DUT and a diagnostic or testing apparatus, the device comprising:

a plurality of first reciprocating conductive bodies each having a first contact at one end and a first abutting body at another end;

a plurality of second reciprocating conductive bodies each having a second contact at one end and a second abutting body at another end;

a plurality of securing means each for holding each of the plurality of first reciprocating conductive bodies and the second reciprocating conductive body together such that the first abutting body is slidably abutting the second abutting body; and a non-conductive housing having a plurality of through holes wherein the plurality of first reciprocating conductive bodies, the plurality of second reciprocating conductive bodies and the plurality of securing means are disposed therein, wherein the non-conductive housing biases the plurality of first reciprocating conductive bodies and the plurality of second reciprocating conductive bodies in opposing directions axially away from each other when pressure is applied on the first contact of the plurality of first reciprocating conductive bodies or the second contact of the plurality of second reciprocating conductive bodies.

17. The device in accordance with claim 16, wherein the first reciprocating conductive body is axially disposed to the second reciprocating conductive body.

18. The device in accordance with claim 16, wherein the non-conductive housing is an elastomer.

19. The device in accordance with claim 16, wherein the first abutting body and the second abutting body are elongated bodies, each having at least one flat surface longitudinally.

20. The device in accordance with claim 19, wherein the at least one flat surface of each of the plurality of second conductive bodies is slidably abutting the at least one flat surface of each of the plurality of first conductive bodies.

21. The device in accordance with claim 16, wherein each of the plurality of first reciprocating conductive bodies further having a first restrictive body located between the two ends thereof, and each of the plurality of second reciprocating conductive bodies further having a second restrictive body located between the two ends thereof.

22. The device in accordance with claim 21, wherein the diameter of the plurality of through holes is substantially constant throughout the length of the plurality of through holes.

23. The device in accordance with claim 22, wherein the diameter of the first restrictive body and the diameter of the second restrictive body are bigger than the diameters of the plurality of through holes, thereby restricting the displacement of the plurality of first reciprocating conductive bodies and the plurality of second reciprocating conductive bodies completely into the plurality of through holes.

24. A method of providing electrical contact between a DUT and a diagnostic apparatus or testing apparatus comprising integrated circuit board, the method comprising the steps of:

a) providing a device comprising:
   a plurality of first reciprocating conductive bodies each having a first contact at one end and a first abutting body at another end;
   a plurality of second reciprocating conductive bodies each having a second contact at one end and a second abutting body at another end;
   a plurality of securing means for holding the plurality of first reciprocating conductive bodies and the second reciprocating conductive body together such that the first abutting body is slidably abutting the second abutting body; and
   a non-conductive housing having a plurality of through holes wherein the plurality of first reciprocating conductive bodies, the plurality of second reciprocating conductive bodies and the plurality of securing means are disposed therein,
   wherein the non-conductive housing biases the plurality of first reciprocating conductive bodies and the plurality of second reciprocating conductive bodies in opposing directions axially away from each other when pressure is applied on the first contact of the plurality of first reciprocating conductive bodies or the second contact of the plurality of second reciprocating conductive bodies;
b) having the first contacts of the plurality of first reciprocating conductive bodies to be in contact with the DUT; and
c) having the second contacts of the plurality of second reciprocating conductive bodies to be in contact with the diagnostic apparatus or testing apparatus comprising integrated circuit board.

* * * * *

UNITED STATES PATENT AND TRADEMARK OFFICE
CERTIFICATE OF CORRECTION

PATENT NO. : 7,772,865 B2  Page 1 of 1
APPLICATION NO. : 12/088853
DATED : August 10, 2010
INVENTOR(S) : Yin Leong Tan It is certified that error appears in the above-identified patent and that said Letters Patent is hereby corrected as shown below:

Column 9, line 14, delete "surface" and replace with "surfaces"

Signed and Sealed this

Ninth Day of November, 2010

David J. Kappos
*Director of the United States Patent and Trademark Office*